June 30, 1970 G. WINSTEL ET AL 3,518,476

LUMINESCENCE DIODE WITH AN $A^{III}B^{V}$ SEMICONDUCTOR MONOCRYSTAL AND AN ALLOYED PLANAR P-N JUNCTION

Original Filed July 5, 1966

United States Patent Office 3,518,476
Patented June 30, 1970

3,518,476

LUMINESCENCE DIODE WITH AN $A^{III}B^{V}$ SEMICONDUCTOR MONOCRYSTAL AND AN ALLOYED PLANAR P-N JUNCTION

Gunter Winstel and Karl-Heinz Zschauer, Munich, Germany, assignors to Siemens Aktiengesellschaft, Munich, Germany, a corporation of Germany Continuation of application Ser. No. 562,742, July 5, 1966. This application Mar. 11, 1969, Ser. No. 806,327
Claims priority, application Germany, July 7, 1965, S 98,027
Int. Cl. H01l 7/46
U.S. Cl. 313—108 5 Claims

ABSTRACT OF THE DISCLOSURE

The invention relates to a luminescence diode comprising an $A^{III}B^{V}$ semiconductor monocrystal. This diode has an external (–1, –1, –1) face, a dopant electrode alloy-bonded on said face, and an alloyed recrystallization region extending from said face into said crystal and forming therein a p–n junction of planar configuration throughout. The recrystallization boundaries which are diagonal to the (–1, –1, –1) face and occur during alloying are removed. Also described is the process of making the above diode.

Figure 1:
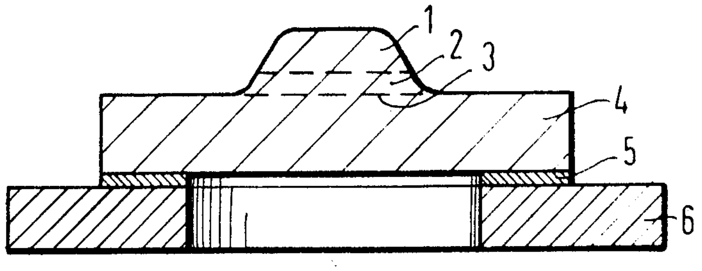

This is a streamlined continuation of application Ser. No. 562,742, filed July 5, 1966, and now abandoned, and relates to a luminescence diode of $A^{III}B^{V}$ semiconductor monocrystal with an alloyed p–n junction.

Luminescence diodes using an $A^{III}B^{V}$ semiconductor monocrystal are known per se. The physical mechanism of electroluminescence by carrier injection through a semiconductor p*n junction resulting in the generation and amplification of stimulated radiation, are also known. A luminescence diode constitutes a light sorce of high light quanta yield. Such a diode, at a sufficient high injection and suitable geometric design as a resonator for light to be emitted, may operate as a laser. The semiconductor p-n junction required, may be produced by the known diffusion method as well as by the likewise known alloying method. The yield of light obtained from luminescence diodes, particularly those of gallium arsenide GaAs, depends greatly upon undesired impurities contained in the crystal. The alloying method is particularly well suitable to minimize the necessity of using high temperatures and long processing periods in the preparation of the p-n junctions. At low alloying temperatures (350–500° C.), however, characteristic, crystallographically distinct alloying fronts occur, which result in a different light yield because of differences in crystalline quality of the recrystallizing layer and/or doping constitution of this layer.

It is an object of the invention to produce a luminescence diode of high light yield in such a manner that, after applying the alloying forces and a subsequent etching away of unsuitable diode portions having a wrong crystal orientation, only the optimal, planar p-n surface area will remain. In order that this planar p-n area, from the outset, forms the main portion of the alloyed p–n junction, the alloying-in must be effected, according to this invention, from the (–1, –1, –1)-face of the crystal that is occupied with pentavalent $B^{V}$ atoms. Furthermore, the alloying must be performed on the largest feasible area down to a penetrating depth, at most 1/10 of the smallest linear dimension of the p–n junction area. In other words, according to the invention, a luminescence diode with an $A^{III}B^{V}$ semiconductor monocrystal and an alloyed p-n junction is produced by alloying the alloy-forming metal into the monocrystal from a (–1, –1, –1)-face of the crystal occupied with pentavalent atoms, for securing a planar p-n junction.

By thus proceeding, recrystallization boundaries occur which extend at an inclination toward the just mentioned face. According to another feature of the invention, these inclined recrystallization boundaries, which are detrimental, are subsequently removed, preferably by etching.

The $A^{III}B^{V}$ compounds crystallize in the zincblende structure. The essential characteristic of this structure is the fact that each atom is located at a corner of a tetrahedron and is thus surrounded by four neighboring atoms from the other atom group. Consequently, each atom of an element from the fifth main group of the periodic system is symmetrically surrounded by four atoms of an element from the third main group of the periodic system and vice versa. Since with $A^{III}B^{V}$ compounds, a symmetry center is absent, the (1, 1, 1) directions and the (–1, –1, –1) directions form polar axes. The (1, 1, 1) direction is the direction from an $A^{III}$ atom (element from the third main group of the periodic system) to an adjacent $B^{V}$ atom (from the fifth main group of the periodic system). Defined as the (–1, –1, –1) direction is the direction from a $B^{V}$ atom an an adjacent $A^{III}$-atom. The corresponding (1, 1, 1) and (–1, –1, –1) faces are perpendicularly intersected by the (1, 1, 1) and (–1, –1, –1) directions respectively. The (1, 1, 1) crystal surface faces consist of atoms from the third main group of the periodic system, whereas the (–1, –1, –1) external crystal faces are formed by atoms from the fifth main group of the periodic system. This is the reason for the difference in the crystallization ability of (1, 1, 1) and (–1, –1, –1) crystal external faces of an $A^{III}B^{V}$-compound. The (–1, –1, –1) face is the more favorable crystal face as it is constituted by atoms from the fifth main group. In this face, only three of the five valence electrons are engaged in the bond with the crystal, whereas the remaining two electrons are available for attachment of further crystal components (GaAs molecules). That is, the entire crystal external face acts as a seed and accordingly accepts a uniform layer. The effect of these free valences upon the dopant substances contained in the melt of the alloy is analogous. This influence is known to result in a dependence of the dopant concentration upon the particular type of crystal face.

It is found that the type of conductivity favorable in the semiconductor monocrystal is that in which the majority charge carriers have a higher mobility than with the other conductivity type. This is tantamount to the fact that with carriers of higher mobility, the specific electrical resistance of the monocrystal is smaller than with the opposed type at the same dopant concentration. Generally therefore, a semiconductor monocrystal of n-type conductivity is preferable, this being particularly applicable to GaAs. The high useful effect of the particularly favorable GaAs luminescence diode results from the fact that radiating processes predominate in the recombination of charge carriers. Since in this material electrons and holes have the same kind of pulse distribution, transition from conductivity band to valence band can occur directly without transmitting pulses onto the crystal lattice. A similar behavior is exhibited, for example, by the $A^{III}B^{V}$ compounds, indium antimonide InSb and indium arsenide InAs. However, materials with indirect band transitions and those with transitions through disturbance energy levels are applicable as long as the adverse, long-radiating processes are kept sufficiently low.

Figure 2:
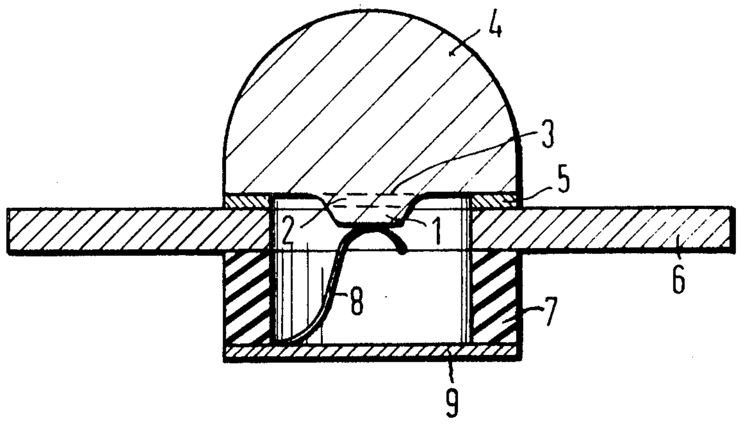

The invention will be further described with reference to the accompanying drawing in which:

FIG. 1 shows schematically in section through a first embodiment of a luminescene diode according to the invention; and FIG. 2 is a sectional view of another embodiment of such a diode.

According to FIG. 1, the luminescene diode comprises an $A^{III}B^{V}$ semiconductor monocrystal 4. An n-type GaAs monocrystal is preferably used. A p-doped region 2 with the aid of an alloy pellet 1 consisting of a tin-zinc alloy is alloyed into this monocrystal. The alloying metal is alloyed into the (–1, –1, –1) top face 3 of the monocrystal 4 for obtaining a planar p-n junction. The resulting recrystallization boundaries, extending at an angle to the top surface are removed by etching. At the crystal face opposite the alloying pellet 1, is an in-alloyed terminal contact 5 of a suitable contact metal, which forms an ohmic contact with the semi-conductor material. The entire semiconductor member is seated on the base plate 6, consisting of molybdenum or of a metal alloy (for example the one available in the trade under the name Vacon) having a thermal coefficient of expansion similar to that of the semiconductor monocrystal 4. The base plate 6 is annular, thus having a center opening for the passage of the light generated in the semiconductor monocrystal.

A particularly higher external efficiency of a luminescence diode is achieved if the shape of the n-doped semiconductor monocrystal 4 has a Weierstrass geometry, such as is exemplified in FIG. 2, wherein the same reference numerals are applied to components functionally corresponding to those shown in FIG. 1 respectively.

The semiconductor monocrystal 4 according to FIG. 2, has aprpoximately the shape of a semisphere joined with a cylindrical portion having the same radius as the semisphere (Weierstrass geometry). This geometry has the effect that the radition generated in the monocrystal will leave the crystal in form of nearly parallel rays in the perpendicularly upward direction and that only slight losses due to stray radiation will occur. The semicircular GaAs crystal 4 is seated above an annular contact electrode 5 which is alloy-bonded through the crystal and joined with a base plate 6 as described above with reference to FIG. 1. A p-type region 2 is alloyed into the monocrystal 4 in a manner analogous to that employed for producing the diode according to FIG. 1. The alloying pellet 1 shown in FIG. 2 consists of a tin-zinc alloy. For securing a planar p-n junction, the alloying metal is alloyed into the (–1, –1, –1) surface area 3 of the monocrystal 4, and the then resulting recrystallization boundaries, extending at an inclination to the surface area, are thereafter removed by etching, preferably by electrolytic etching in an aqueous solution of 4% $K_3[Fe(CN)_6]$+0.5% KOH. The base plate 6 has a ring shaped opening coextensive with the annular opening of the contact electrode 5 around the periphery of the circular base area of the monocrystal 4. Suitable contact metals for the above-mentioned terminal contact 5 are tin or tin-platinum alloys. The base plate 6 is mounted on a hollow cylinder 7 of insulating material, and the entire arrangement is covered by a metal plate 9 from which an elastic contact connection 8 extends through the opening of the base plate 6 to the alloyed pellet 1. A gold-plated gauze strip of copper or bronze is used as the elastic contact connection 8, which is soldered with the alloying pellet 1 and the metal plate 9.

As mentioned, the alloying of the p-n junction according to the invention from the (–1, –1, –1)-surface area of the semiconductor monocrystal must be effected on the largest feasible area and down to a slight depth so that this planar p-n junction area, from the outset, constitutes the main portion of the alloyed p-n junction. It is advisable to employ the known alloying process employed for the production of electrical semiconductor devices by embedding them in powder for this purpose. This process described in detail in German Pat. No. 1,015,152 and German Pat. No. 1,046,198, not only facilitates securing the desired uniform thickness of the resulting alloyed layer, but also, preserves the desired external shape or area shape.

To those skilled in the art it will be obvious from a study of this disclosure that with respect to details such as a shape and design, the invention permits of various modifications and may be given embodiments other than particularly illustrated herein, without departing from the essential features of the invention and with the scope of the claims annexed hereto.

We claim:

1. A luminescence diode comprising an $A^{III}B^{V}$ semiconductor monocrystal having an external (–1, –1, –1)-face, a dopant electrode alloy-bonded on said face, and an alloyed recrystallization region extending from said face into said crystal and forming therein a large area p-n junction of planar configuration throughout, the depth of penetration of said p-n junction into said semiconductor monocrystal is at most 1/10 of the smallest linear dimension of the area of said p-n junction and the recrystallization boundaries which are diagonal to the (–1, –1, –1)-face being absent.

2. A diode as claimed in claim 1, in which said monocrystal is n-doped GaAs.

3. A diode as claimed in claim 1, in which said monocrystal substantially conforms with the Weierstrass geometry.

4. A diode as claimed in claim 1, in which said pellet is a tin-zinc alloy.

5. A method of manufacturing a luminescence diode comprising an $A^{III}B^{V}$ semiconductor monocrystal in which there is a flat p-n junction which comprises alloying a tin-zinc pellet into the (–1, –1, –1)-surface of the monocrystal with the monocrystal and pellet embedded in powder and etching away the resultant recrystallization boundaries disposed obliquely in relation to this surface.

References Cited

UNITED STATES PATENTS

| | | | |
|---|---|---|---|
| 2,840,885 | 7/1958 | Cressell | 29—583 |
| 2,861,165 | 11/1958 | Aigrain et al. | 250—88 |
| 3,152,023 | 10/1964 | Minamoto | 148—185 X |
| 3,265,990 | 8/1966 | Burns et al. | 331—94.5 |
| 3,293,513 | 12/1966 | Biard et al. | 313—108 X |
| 3,302,051 | 1/1967 | Galginaitis | 313—108 |

JAMES W. LAWRENCE, Primary Examiner

P. C. DEMEO, Assistant Examiner

U.S. Cl. X.R.

148—185